United States Patent
Van Der Schaar et al.

(10) Patent No.: US 7,565,219 B2
(45) Date of Patent: Jul. 21, 2009

(54) LITHOGRAPHIC APPARATUS, METHOD OF DETERMINING A MODEL PARAMETER, DEVICE MANUFACTURING METHOD, AND DEVICE MANUFACTURED THEREBY

(75) Inventors: Maurits Van Der Schaar, Veldhoven (NL); Jeroen Huijbregstse, Breda (NL); Sicco Ian Schets, Eindhoven (NL); Bart Luc Swinnen, Holsbeek (BE)

(73) Assignee: ASML Netherlands B.V., Veldhoven (NL)

( * ) Notice: Subject to any disclaimer, the term of this patent is extended or adjusted under 35 U.S.C. 154(b) by 1058 days.

(21) Appl. No.: 10/730,254

(22) Filed: Dec. 9, 2003

(65) Prior Publication Data

US 2005/0123843 A1   Jun. 9, 2005

(51) Int. Cl.
*G06F 19/00* (2006.01)

(52) U.S. Cl. .................... 700/121; 700/120; 700/125

(58) Field of Classification Search ......... 700/120–121, 700/125
See application file for complete search history.

(56) References Cited

U.S. PATENT DOCUMENTS

| | | | | |
|---|---|---|---|---|
| 4,200,395 A * | 4/1980 | Smith et al. | ................. | 356/509 |
| 4,311,389 A * | 1/1982 | Fay et al. | ................. | 356/509 |
| 4,402,610 A * | 9/1983 | Lacombat | ................. | 356/400 |
| 5,229,872 A | 7/1993 | Mumola | | |
| 5,296,891 A | 3/1994 | Vogt et al. | | |
| 5,416,562 A * | 5/1995 | Ota et al. | ................. | 355/53 |
| 5,523,193 A | 6/1996 | Nelson | | |
| 5,525,808 A * | 6/1996 | Irie et al. | ................. | 250/548 |
| 5,532,091 A * | 7/1996 | Mizutani | ................. | 430/22 |
| 5,703,685 A * | 12/1997 | Senda et al. | ................. | 356/401 |
| 5,801,390 A * | 9/1998 | Shiraishi | ................. | 250/559.3 |
| 5,969,441 A | 10/1999 | Loopstra et al. | | |
| 6,046,792 A | 4/2000 | Van Der Werf et al. | | |
| 6,084,673 A * | 7/2000 | Van Den Brink et al. | ..... | 356/492 |
| 6,091,481 A * | 7/2000 | Mori | ................. | 355/67 |
| 6,278,957 B1 * | 8/2001 | Yasuda et al. | ................. | 702/150 |
| 6,285,455 B1 * | 9/2001 | Shiraishi | ................. | 356/486 |
| 6,297,876 B1 | 10/2001 | Bornebroek | | |
| 6,693,713 B1 * | 2/2004 | Nakajima | ................. | 356/400 |
| 7,070,405 B2 * | 7/2006 | Sreenivasan et al. | ..... | 425/174.4 |
| 7,332,732 B2 * | 2/2008 | Van Bilsen et al. | ................. | 250/548 |
| 2002/0014601 A1 * | 2/2002 | Yoshida | ................. | 250/548 |
| 2002/0147507 A1 * | 10/2002 | Stanton | ................. | 700/30 |
| 2002/0147520 A1 * | 10/2002 | Mos et al. | ................. | 700/125 |

FOREIGN PATENT DOCUMENTS

| | | |
|---|---|---|
| JP | 08-097114 | 4/1996 |
| JP | 08-288197 | 11/1996 |
| JP | 09-246175 | 9/1997 |

(Continued)

*Primary Examiner*—Ronald D Hartman, Jr.
(74) *Attorney, Agent, or Firm*—Pillsbury Winthrop Shaw Pittman LLP

(57) ABSTRACT

A method according to one embodiment of the invention relates to determining at least one parameter of a model that provides information about a position of an object. The object has a plurality of alignment marks of which desired positions are known. The method includes measuring a plurality of positional parameters for each alignment mark. Based on the measured plurality of positional parameters, which are weighted with weighing coefficients, at least one parameter of the model of the object is determined. The numerical value of each weighing coefficient is determined together with the at least one parameter of the model.

9 Claims, 2 Drawing Sheets

FOREIGN PATENT DOCUMENTS

| | | |
|---|---|---|
| JP | 10-022190 | 1/1998 |
| JP | 10-022207 | 1/1998 |
| WO | 98/33096 A1 | 7/1998 |
| WO | 98/38597 A2 | 9/1998 |
| WO | 98/38597 A3 | 9/1998 |
| WO | 98/40791 A1 | 9/1998 |

* cited by examiner

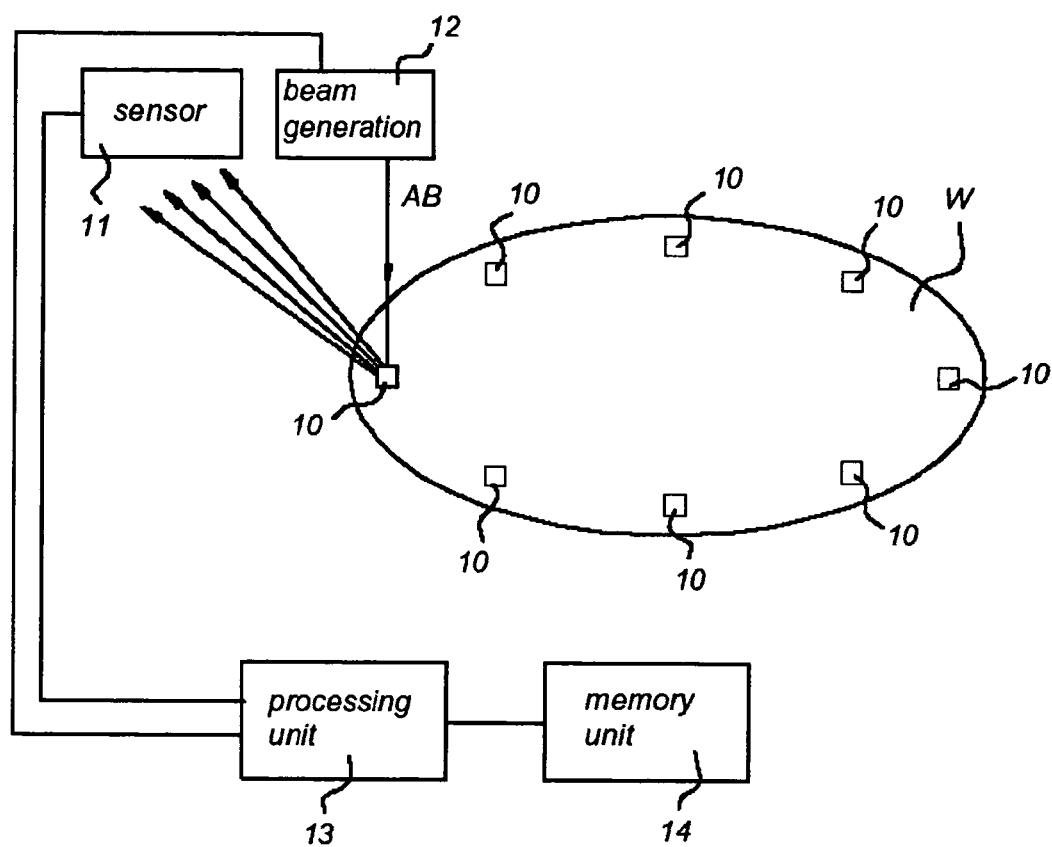

LITHOGRAPHIC APPARATUS, METHOD OF DETERMINING A MODEL PARAMETER, DEVICE MANUFACTURING METHOD, AND DEVICE MANUFACTURED THEREBY

FIELD OF THE INVENTION

The present invention relates to positioning of an object and to lithographic projection apparatus and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. It should be appreciated that the pattern "displayed" on the patterning structure may differ substantially from the pattern eventually transferred to e.g. a substrate or layer thereof (e.g. where pre-biasing of features, optical proximity correction features, phase and/or polarization variation techniques, and/or multiple exposure techniques are used). Generally, such a pattern will correspond to a particular functional layer in a device being created in the target portion, such as an integrated circuit or other device (see below). Patterning structure may be reflective and/or transmissive. Examples of patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An array of grating light valves (GLVs) may also be used in a corresponding manner, where each GLV may include a plurality of reflective ribbons that can be deformed relative to one another (e.g. by application of an electric potential) to form a grating that reflects incident light as diffracted light. A further alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. Nos. 5,296,891 and 5,523,193 and PCT patent applications WO 98/38597 and WO 98/33096, which documents are incorporated herein by reference. In the case of a programmable mirror array, the support structure may be embodied as a frame or table, for example, which may be fixed or movable as required.

A programmable LCD panel. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask (or "reticle") and mask table (or "reticle table"); however, the general principles discussed in such instances should be seen in the broader context of the patterning structure as hereabove set forth.

A lithographic apparatus may be used to apply a desired pattern onto a surface (e.g. a target portion of a substrate). Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies and/or portion(s) thereof) on a substrate (e.g. a wafer of silicon or other semiconductor material) that has been coated with a layer of radiation-sensitive material (e.g. resist). In general, a single wafer will contain a whole matrix or network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features. This set of procedures may be used as a basis to pattern an individual layer of a device (e.g. an IC). For example, these transfer procedures may result in a patterned layer of resist on the substrate. One or more pattern processes may follow, such as deposition, etching, ion-implantation (doping), metallization, oxidation, chemo-mechanical polishing, etc., all of which may be intended to create, modify, or finish an individual layer. If several layers are required, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing," Third Edition, by Peter van Zant, McGraw Hill Publishing Co., 1997, ISBN 0-07-067250-4.

A substrate as referred to herein may be processed before or after exposure: for example, in a track (a tool that typically applies a layer of resist to a substrate and develops the exposed resist) or a metrology or inspection tool. Where applicable, the disclosure herein may be applied to such and other substrate processing tools. Further, the substrate may be processed more than once (for example, in order to create a multi-layer IC), so that the term substrate as used herein may also refer to a substrate that already contains multiple processed layers.

The term "projection system" should be broadly interpreted as encompassing various types of projection system, including refractive optics, reflective optics, and catadioptric systems, for example. A particular projection system may be selected based on factors such as a type of exposure radiation used, any immersion fluid(s) or gas-filled areas in the exposure path, whether a vacuum is used in all or part of the exposure path, etc. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g. water) so as to fill a space between the final element of the projection system and the substrate. Immersion liquids may also be applied to other spaces in the lithographic apparatus, for example, between the mask and the first element of the projection system. The use of immersion techniques to increase the effective numerical aperture of projection systems is well known in the art.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams (such as ion or electron beams).

Although specific reference may be made in this text to the use of lithographic apparatus in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, DNA analysis devices, etc. The skilled artisan will appreciate that, in the context of such alternative applications, any use of the terms "wafer" or "die" in this text should be considered as being replaced by the more general terms "substrate" and "target portion," respectively.

As described above, a number of patterned layers may be created on a substrate. In order to create an operating device or to provide optimal performance, it may be desirable or even necessary for the patterns of layers positioned on top of each other to be well aligned with respect to each other. Such a condition may be accomplished by accurately positioning the substrate with respect to the mask and the projection beam.

In the first place, it may be desirable or necessary for the substrate to be in the focal plane of the patterned beam, in order to obtain a sharp image of the patterning structure (a process also known as "leveling"). The direction associated with this distance is called the z-direction.

Secondly, it may be desirable or necessary to accurately set the position of the substrate in the directions perpendicular to the z-direction, i.e. the x- and y-direction, in order to position the different layers correctly on top of each other (a process also known as "aligning"). Accurate aligning is generally done by accurately determining the position of the substrate relative to a substrate table which holds the substrate and determining the position of the substrate table with respect to the mask and projection beam. Alignment may be done using an alignment system, as described for instance in U.S. Pat. No. 6,297,876, which document is incorporated herein by reference.

The shape of the substrate may differ from an ideal shape of the substrate. Differences of the shape may be caused by the shape of the underlying surface (for instance, a pimple structure of a substrate table) but may also be influenced by a clamp used to clamp the substrate to, for instance, the substrate table. For example, the forces generated by the clamp may deform the substrate, at least locally. In order to project a patterned beam as accurately as possible, information about the exact shape of the substrate may be required.

Information about the position and/or shape of the substrate may be obtained by measuring the position of one or more alignment marks provided on the substrate. Alignment marks may be arranged to diffract light when illuminated, such that the diffracted light may be detected by one or more sensors. From the detected signal, information may be derived about the position of the mark. For instance, such alignment marks may be formed by gratings that produce a diffraction pattern when illuminated with an alignment beam. Measuring the position of a diffraction order of a diffraction pattern, as produced by the alignment mark with respect to the sensor(s), may be used to provide information about the position of the alignment mark and thus the position of the substrate.

However, the results of known methods are not always accurate enough. Therefore, it is desirable to obtain a method that is more accurate.

SUMMARY

A method according to one embodiment of the invention includes determining at least one parameter of a model. The model provides information about a position of an object that is provided with a plurality of alignment marks of which desired positions are known. The method includes measuring a plurality of positional parameters for each alignment mark. Based on the measured plurality of positional parameters, the at least one parameter of the model of the object is determined. The plurality of positional parameters for each alignment mark are weighted with weighing coefficients, and the numerical value of at least one of the weighing coefficient is determined together with the at least one parameter of the model. Modifications of such a method are disclosed, including methods for manufacturing devices, as well as apparatus that may be used to determine a position of an object.

BRIEF DESCRIPTION OF THE DRAWINGS

Embodiments of the invention will now be described, by way of example only, with reference to the accompanying schematic drawings in which:

FIG. 2 depicts a measurement setup including a substrate W according to an embodiment of the invention.

In the Figures, corresponding reference symbols indicate corresponding parts.

DETAILED DESCRIPTION

Figure 1:
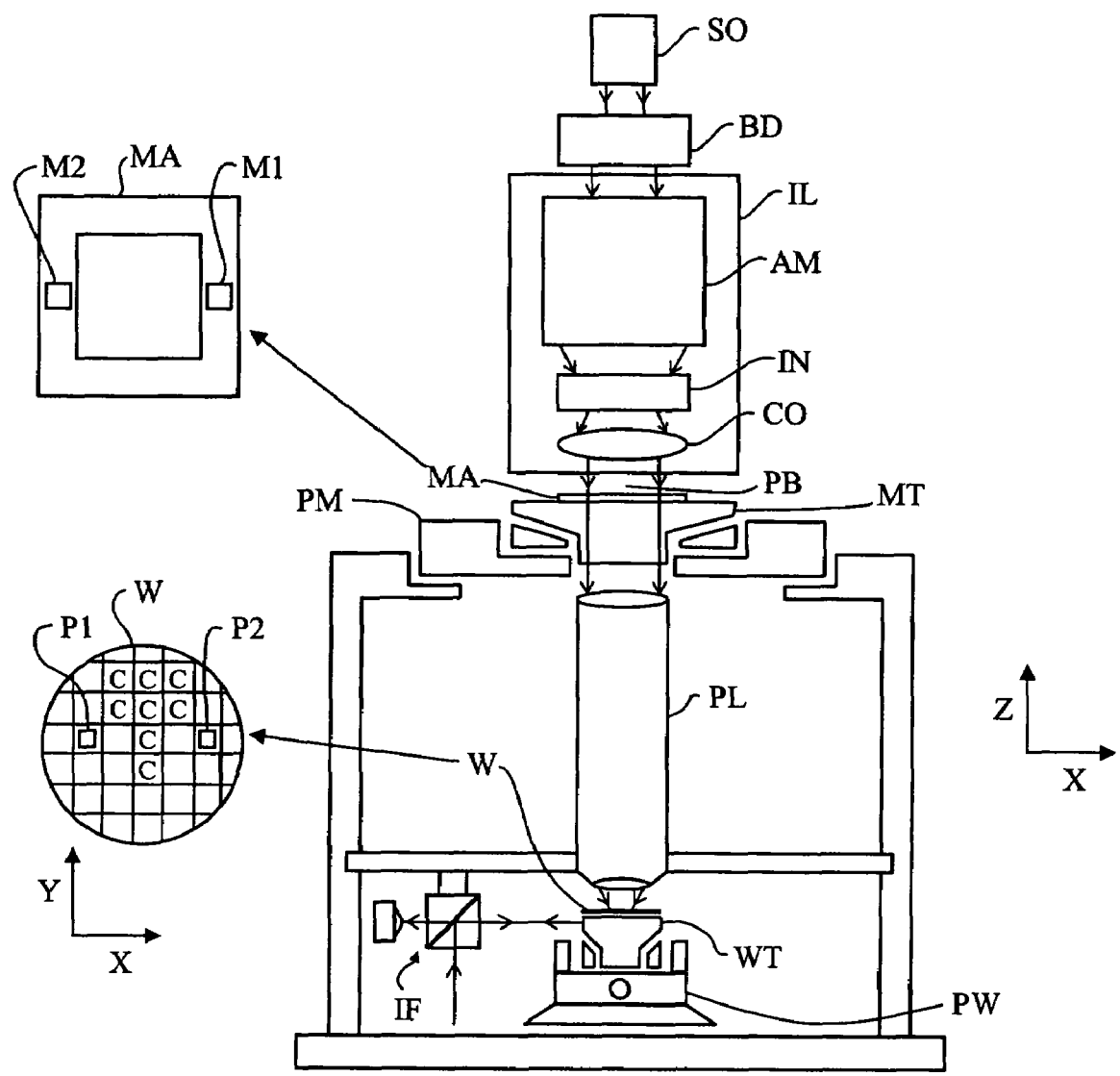
FIG. 1 depicts a lithographic apparatus according to an embodiment of the invention.

Embodiments of the invention include, for example, a method of determining at least one parameter of a model that provides information about a position of an object, such as a substrate (and possibly other information, such as information pertaining to deformation of the object).

FIG. 1 schematically depicts a lithographic projection apparatus according to a particular embodiment of the invention. The apparatus comprises:

A radiation system configured to supply (e.g. having structure capable of supplying) a projection beam of radiation (e.g. UV or EUV radiation). In this particular example, the radiation system RS comprises a radiation source SO, a beam delivery system BD, and an illumination system including adjusting structure AM (e.g. for setting an illumination node), an integrator IN, and condensing optics CO;

A support structure configured to support a patterning structure capable of patterning the projection beam. In this example, a first object table (mask table) MT is provided with a mask holder for holding a mask MA (e.g. a reticle), and is connected to a first positioning structure PM for accurately positioning the mask with respect to item PL;

A second object table (substrate table) configured to hold a substrate. In this example, substrate table WT is provided with a substrate holder for holding a substrate W (e.g. a resist-coated semiconductor wafer), and is connected to a second positioning structure PW for accurately positioning the substrate with respect to item PL and (e.g. interferometric) measurement structure IF, which is configured to accurately indicate the position of the substrate and/or substrate table with respect to lens PL; and A projection system ("lens") configured to project the patterned beam. In this example, projection system PL (e.g. a refractive lens group, a catadioptric or catoptric system, and/or a mirror system) is configured to image an irradiated portion of the mask MA onto a target portion C (e.g. comprising one or more dies and/or portion(s) thereof) of the substrate W. Alternatively, the projection system may project images of secondary sources for which the elements of a programmable patterning structure may act as shutters. The projection system may also include a microlens array (MLA), e.g. to form the secondary sources and to project microspots onto the substrate.

As here depicted, the apparatus is of a transmissive type (e.g. has a transmissive mask). However, in general, it may also be of a reflective type, for example (e.g. with a reflective mask). Alternatively, the apparatus may employ another kind of patterning structure, such as a programmable mirror array of a type as referred to above.

The source SO (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a beam delivery system BD, which may include suitable directing mirrors and/or a conditioning structure or field, such as a beam expander. The illuminator IL may comprise an adjusting structure or field AM for setting the outer and/or inner radial extent (commonly referred to as σ-outer and σ-inner, respectively) of the intensity distribution in a pupil plane of the illuminator, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA may have a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable direction mirrors); this latter scenario is often the case when the source LA is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure PW (and interferometric measuring structure IF), the substrate table WT can be moved accurately, e.g. so as to position different target portions C in the path of the beam PB. Similarly, the first positioning structure PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in several different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above-described modes of use or entirely different modes of use may also be employed.

A diffraction pattern (e.g. as generated by an alignment beam projected to an alignment mark) may comprise a number of diffraction orders, and some number (for instance, seven) of the diffraction orders may be measured. Each diffraction orders line comprises positional information about the alignment mark. In many cases, a position of the alignment mark can be determined based on the determined position of a single diffraction order, but more accurate results may be obtained when more diffraction orders are taken into account.

It is known to calculate a wafer model (i.e. numerical values for the translation T, the rotation R and/or the expansion Exp of a substrate) before exposure, that can be used to compute the position, expansion and/or orientation of a substrate based on the measured positions of the diffraction orders. Such a technique may include assigning a weighing coefficient to each diffraction order. If, for instance, seven diffraction orders (i=1, 2, . . . , 7) are measured for the x-direction, 7 weighing coefficients $\alpha_i$ may be defined. These weighing coefficients may be positive or negative, but it may be desirable for the weighing coefficients to be defined and/or normalized such that their sum equals one:

$$\sum_i \alpha_i = 1.$$

For the y-direction, other weighing coefficients $\beta_i$ may be defined. Alignment beams may be used that comprise more than one color (for instance, red and green), so that more diffraction orders may be generated by the alignment beams, and the wafer model may comprise more weighing coefficients.

A single alignment mark may comprise more than one grating. For example, a first grating might be directed in a first direction (x), while a second grating might be directed in a second direction (y), which may be substantially perpendicular to the first direction. In such cases, a single alignment mark may be used to obtain information on position in more than one direction or dimension.

Usually the position of a substrate (or portion thereof) will be determined based on positional information derived from a number of alignment marks, which may be spread over the surface of the substrate. In general, the more alignment marks are measured, the more accurately the position of the substrate may be determined.

After the position of a plurality of alignment marks across the surface of the substrate is determined, this information may be supplied to a deformation model. For example, the deformation model may be arranged to determine the position and orientation of each target portion of the substrate. The deformation model may also be arranged to determine deformation within a target portion. The results of such a deformation model may be used to make sure that each target portion will be correctly aligned during exposure.

The position of the substrate may be expressed as a translation T, a rotation R, and an expansion Exp. The translation may be in the x-direction $T_x$ and/or in the y-direction $T_y$. The rotation may be a rotation of the x-axis around the z-axis $R_{zx}$ and/or a rotation of the y-axis around the z-axis $R_{zy}$. The expansion may be an expansion in the direction of the x-axis $Exp_x$ and/or in the direction of the y-axis $Exp_y$.

With the measurements of the diffraction orders of the different marks, together with the weighing coefficients, a wafer model comprising the translation, rotation, and expansion may be determined. Such a model may be determined using, e.g., a least square method, as will be understood by a person skilled in the art and as will be explained below. Computing the wafer model parameters may include minimizing the differences between the computed positions of the alignment marks and the measured positions of the alignment marks.

In a method according to an embodiment of the invention, the numerical value of each weighing coefficient is determined together with the at least one parameter of the model. Such a method provides a dynamic recipe, in that it may adjust its weighing parameters to each new situation. Therefore, it is flexible and may provide results that are more accurate. Such a method can be applied for determining the parameters of a model, such as the translation T, the rotation R, and the expansion Exp. From these, the position and/or deformation of an object, such as a substrate, may be determined in a single direction, for instance, the x-direction, but may also very well be used to determine the position and/or deformation of an object in two directions, the x and y direction, and may also be applied to determine the position and/or deformation of the object in three directions, x, y and z direction. Furthermore, the method might be used to determine the rotational position of the object with respect to one or more of these directions. Thus, one potential advantage of such a method is increased accuracy in position determination.

In a method according to a further embodiment of the invention, the at least one parameter of the model is at least one of translation, rotation and expansion. With these three parameters, the position and deformation may very well be expressed. The translation may be a translation in a first direction and/or a translation in a second direction. The rotation may be a rotation of the object as a whole around a certain axis, but may also express rotational deformation, for example, as a rotational position of a first axis with respect to a second axis (e.g. the x axis with respect to the y axis). Also the expansion may express lateral deformation (e.g. different expansions for different directions).

In a substrate according to a further embodiment of the invention, the plurality of alignment marks are formed as diffractive elements (such as multigratings), such that the plurality of positional parameters may be determined, e.g., by diffraction lines generated by projecting an alignment beam to the plurality of alignment marks. Diffractive elements, such as gratings, are well suited for providing positional information. A multigrating mark may have three good signal orders for each color. Information about the position of such a grating can easily be obtained by projecting an alignment beam to the diffractive element and measuring the position of the diffractive pattern.

In a method according to a further embodiment of the invention, the at least one parameter of the model is solved by minimizing the expression $$\sum_{\forall i} \sqrt{(x_{meas,i} - x_{nom})^2 + (y_{meas,i} - y_{nom})^2}$$

for a plurality of (possibly all of) the alignment marks, where $x_{meas,i}$ and $y_{meas,i}$ denote measured positions of the alignment marks based on an i-th positional parameter in an x-direction and y-direction, respectively, and $x_{nom}$ and $y_{nom}$ denote desired positions in the x and y-direction, respectively. Such a technique may be used as a relatively easy way of computing wafer model parameters.

A method according to a further embodiment of the invention includes setting the value of a weighing coefficient to zero when the signal strength of a corresponding positional parameter is below a certain threshold. If the measured signal of, for instance, a particular diffraction order is too weak, the signal could be ignored by setting the corresponding weighing coefficient to zero.

In a method according to a further embodiment of the invention, the object is a substrate. In the case of a substrate processed by a lithographic apparatus, it may be necessary to determine the position and shape of a substrate accurately in order to allow accurate projection of a patterned beam.

A device manufacturing method according to another embodiment of the invention includes providing a substrate, providing a beam of radiation using an illumination system, using a patterning structure to impart the projection beam with a pattern in its cross-section, and projecting the patterned beam of radiation onto a target portion of the substrate, wherein a method as described herein is performed before the patterned beam is projected.

In a method according to a further embodiment of the invention, the numerical value of each weighing coefficient is determined based on measurements of at least one substrate, and the determined numerical value of each weighing coefficient is used during determination of the at least one parameter of the model for subsequent substrates. One potential advantage of such a method is that a calculation procedure as described herein only needs to be done a relatively low number of times, for instance, only for the first 3 substrates from a batch. In at least some circumstances, it may be appropriate to assume that the same weighing coefficients can be used for subsequent substrates from that batch.

A lithographic apparatus according to a further embodiment of the invention includes an illumination system for providing a beam of radiation; a support structure for supporting a patterning structure, the patterning structure serving to impart the beam with a pattern in its cross-section; a substrate table for holding a substrate; and a projection system for projecting the patterned beam onto a target portion of the substrate. Such a lithographic apparatus also includes a processing unit, a beam generator and a sensor. The beam generator (e.g. a laser emitter) is arranged to project an alignment beam to a plurality of alignment marks formed on the substrate, generating at least two positional parameters for each alignment mark, of which desired positions are known. The sensor is arranged to measure the positional parameters and transfer the measured positional parameters to the processing unit. The processing unit, which is arranged to communicate with the sensor, is also arranged to determine at least one parameter of a model, based on the measured plurality of positional parameters, while the plurality of positional parameters for each alignment mark are weighted with weighing coefficients, the model providing information about at least a position of the substrate. In such an apparatus, the processing unit determines the numerical value of each weighing coefficient together with the at least one parameter of the model.

In a method according to a further embodiment of the invention, the weighing coefficients $\alpha_i$ are not determined beforehand (e.g. as in a static recipe), but are variables that can be varied while solving the least squares solution in order to determine the wafer model (i.e. a dynamic recipe).

As discussed above, the position and/or shape of the substrate W may be expressed as a translation ($T_x$, $T_y$), a rotation of the x-axis around the z-axis ($R_{zx}$, here denoted as $R_x$) and a rotation of the y-axis around the z-axis ($R_{zy}$, here denoted as $R_y$) and an expansion in the x-direction ($Exp_x$) and the y-direction ($Exp_y$). One such model is called the 6-parameter wafer model with, for the X-direction:

$$T_x + EXP_x x_{nom}(X_N) - R_x y_{nom}(X_N) = x_{meas}(X_N) - x_{nom}(X_N) \quad (1)$$

and for the Y direction:

$$T_y + EXP_y y_{nom}(Y_N) + R_y x_{nom}(Y_N) = y_{meas}(Y_N) - y_{nom}(Y_N).$$

Here, $X_N$ and $Y_N$ denote the X and Y values obtained by measuring the Nth alignment mark, $x_{meas}$ and $y_{meas}$ denote the measured values of X and Y, and $x_{nom}$ and $y_{nom}$ denote a desired location of the measured alignment mark.

For reasons of simplicity, in the embodiment discussed below, $R_{zx}$ will be assumed to equal $R_{zy}$ (i.e. no rotational deformation of the substrate W) and $Exp_x$ will be assumed to equal $Exp_y$ (i.e. the expansion is equal in the x and y direction). One such model is called the 4-parameter wafer model ($T_x$, $T_y$, Exp, R), although it must be understood that embodiments of the invention may be applied as well to wafer models having six parameters, and also to models having other combinations of parameters.

As is depicted in FIG. 2, a number of alignment marks 10 are provided on a substrate W. The alignment marks 10 are arranged to generate a number of positional indicators, providing information about the position of each alignment mark 10 to a sensor 11. The sensor 11 is arranged to provide its measurements to a processing unit 13. The processing unit 13 may be arranged to store these measurements in a memory unit 14. There may be applied a plurality of sensors instead of one. Also, the substrate may have other alignment marks that do not provide information to sensor 11 in such a manner and/or whose information is not included in one or more calculations as described herein.

In FIG. 2, the alignment mark 10 is a diffractive element, for instance, formed by a grating. A beam generator 12 is arranged to provide an alignment beam AB (e.g. a laser beam) which is projected to one of the alignment marks 10. The beam generator 12 may be controlled by the processing unit 13. The alignment beam AB in combination with alignment mark 10, here formed as a grating, generates a number of diffraction orders of which the position is measured by the sensor 11. The measurements of the sensor 11 are transferred to the processing unit 13, that is arranged to compute the position of the substrate W according to the method as described below. The results may be stored in the memory unit 14.

In order to obtain positional information about the different alignment marks 10, the alignment beam AB needs to be projected to these other alignment marks 10. This may be done by moving the substrate W with respect to the beam generator 12 and the sensor 11. Therefore, the substrate W is preferably positioned on an implementation of substrate table WT that is moveable (e.g. via a positioning structure W). However, it is also possible to move the beam, the beam generator 12, and/or the sensor with respect to the substrate W.

In general, the grid parameters $T_x$, $T_y$, R and Exp in case of N alignment marks 10 are obtained by solving a set of equations using a method of least squares. All alignment marks 10 each comprise a grating directed in the X- and Y-direction, so N pairs $(X_1, X_2, \ldots X_N; Y_1, Y_2, \ldots Y_N)$ are obtained by least-squares solving a set of 2N equations, consisting of N equations for X:

$$T_x + \text{Exp } x_{nom}(X_1) - R\, y_{nom}(X_1) = x_{meas}(X_1) - x_{nom}(X_1) \quad (2)$$
$$T_x + \text{Exp } x_{nom}(X_2) - R\, y_{nom}(X_2) = x_{meas}(X_2) - x_{nom}(X_2)$$
$$\vdots$$
$$T_x + \text{Exp } x_{nom}(X_N) - R\, y_{nom}(X_N) = x_{meas}(X_N) - x_{nom}(X_N)$$

and N equations for Y:

$$T_y + \text{Exp } y_{nom}(Y_1) + R\, x_{nom}(Y_1) = y_{meas}(Y_1) - y_{nom}(Y_1)$$
$$T_y + \text{Exp } y_{nom}(Y_2) + R\, x_{nom}(Y_2) = y_{meas}(Y_2) - y_{nom}(Y_2)$$
$$\vdots$$
$$T_y + \text{Exp } y_{nom}(Y_N) + R\, x_{nom}(Y_N) = y_{meas}(Y_N) - y_{nom}(Y_N)$$

In a method according to some embodiments of the invention, the wafer model parameters (T, R, Exp) are solved as described in Eq. (1) or (2). Instead of solving the wafer model parameters (T, R, Exp) according to a predetermined recipe based on the measured positions and based on predetermined weighing coefficients, the weighing coefficients are also solved together with the wafer model parameters (T, R, Exp), with the boundary condition that the sum of the weighing coefficients equals one (i.e. the sum of the alpha's is equal to one).

These 2N equations are solved simultaneously. In matrix notation the full set of equations (X and Y) may be written as:

$$\begin{pmatrix} 1 & 0 & x_{nom}(X_1) & -y_{nom}(X_1) \\ 1 & 0 & x_{nom}(X_2) & -y_{nom}(X_2) \\ \vdots & \vdots & \vdots & \vdots \\ 1 & 0 & x_{nom}(X_N) & -y_{nom}(X_N) \\ 0 & 1 & y_{nom}(Y_1) & x_{nom}(Y_1) \\ 0 & 1 & y_{nom}(Y_2) & x_{nom}(Y_2) \\ \vdots & \vdots & \vdots & \vdots \\ 0 & 1 & y_{nom}(Y_N) & x_{nom}(Y_N) \end{pmatrix} \begin{pmatrix} T_x \\ T_y \\ \text{Exp} \\ R \end{pmatrix} = \begin{pmatrix} x_{meas}(X_1) - x_{nom}(X_1) \\ x_{meas}(X_2) - x_{nom}(X_2) \\ \vdots \\ x_{meas}(X_N) - x_{nom}(X_N) \\ y_{meas}(Y_1) - y_{nom}(Y_1) \\ y_{meas}(Y_2) - y_{nom}(Y_2) \\ \vdots \\ y_{meas}(Y_N) - y_{nom}(Y_N) \end{pmatrix} \quad (3)$$

or $A\underline{x} = \underline{b}$ in short. As will be known to a person skilled in the art, the least squares solution may be expressed as:

$$\underline{x} = (A^T A)^{-1} A^T \underline{b}.$$

In an exemplary (and non-limiting) application of such a method, the alignment beam (AB) comprises 2 wavelengths or colors (for instance: red and green) and each alignment mark 10 generates seven diffraction lines for each color. In total, 14 diffraction lines are generated. In this case, it may be desirable to determine not only the 4 wafer model parameters ($T_x$, $T_y$, R and Exp), but also 14 weighing coefficients $\alpha_i$. Now we introduce a measured position that is a linear combination of the individual measured order positions:

$$x_{meas} = \sum_{i=1}^{14} \alpha_i x_{meas,i} \quad (5)$$

for i=1 (the first red measured position) to 14 (the seventh green measured position). In fact, the coefficients $\alpha_i$ make up the (static) alignment recipe. Substituting Eq. (5) in Eq. (1), we obtain:

$$T_x + \text{Exp}\, x_{nom} - R y_{nom} = \sum_{i=1}^{14} \alpha_i x_{meas,i} - x_{nom}$$

which may be rewritten as $$T_x + \text{Exp}\, x_{nom} - R y_{nom} - \sum_{i=1}^{14} \alpha_i x_{meas,i} = -x_{nom}. \quad (6)$$

The above may be written in matrix notation (for one mark) as follows:

$$\begin{pmatrix} 1 & x_{nom} & -y_{nom} & -x_{meas,1} & \cdots & -x_{meas,14} \end{pmatrix} \begin{pmatrix} T_x \\ \text{Exp} \\ R \\ \alpha_1 \\ \vdots \\ \alpha_{14} \end{pmatrix} = (-x_{nom}) \quad (6.1)$$

As was stated above, a different set of weighing coefficients may be determined for the x and the y direction. In this example it is assumed that the weighing coefficients α for the diffraction orders in the x direction are similar to the weighing coefficients β for the diffraction orders in the y direction, so $$\forall i: \alpha_i = \beta_i \quad (5)$$

Of course, it is possible to go through this recipe without imposing this constraint. Now adding the marks that provide information about the y position of the substrate and imposing that the same recipe, i.e. the same coefficients are applied for the y direction ($\alpha_i = \beta_i$):

$$\begin{pmatrix} 1 & 0 & x_{nom} & -y_{nom} & -x_{meas,1} & \cdots & -x_{meas,14} \\ 0 & 1 & y_{nom} & x_{nom} & -y_{meas,1} & \cdots & -y_{meas,14} \end{pmatrix} \begin{pmatrix} T_x \\ T_y \\ \text{Exp} \\ R \\ \alpha_1 \\ \vdots \\ \alpha_{14} \end{pmatrix} = \begin{pmatrix} -x_{nom} \\ -y_{nom} \end{pmatrix} \quad (7)$$

The unknowns consist of the four wafer model parameters ($T_x$, $T_y$, M, R) and the 14 coefficients $\alpha_i$. Note, however, that negative coefficients are also allowed (e.g. for a predictive recipe). The only restriction for the weighing coefficients is that the sum of these must equal 1, so the number of unknown $\alpha_i$'s in this case is reduced to 13:

$$\sum_{i=1}^{14} \alpha_i = 1 \rightarrow \alpha_{14} = 1 - \sum_{i=1}^{13} \alpha_i \quad (8)$$

Inserting this constraint into equation (6), we obtain $$T_x + \text{Exp} x_{nom} - R y_{nom} - \sum_{i=1}^{14} \alpha_i x_{meas,i} = T_x + \text{Exp} x_{nom} - R y_{nom} - \sum_{i=1}^{13} \alpha_i (x_{meas,i} - x_{meas,14}) - x_{meas,14}$$

$$= -x_{nom}$$

which may be rewritten as $$T_x + \text{Exp} x_{nom} - R y_{nom} - \sum_{i=1}^{13} \alpha_i (x_{meas,i} - x_{meas,14}) = x_{meas,14} - x_{nom}. \quad (9)$$

The full matrix (7) can now be simplified into:

$$\begin{pmatrix} 1 & 0 & x_{nom} & -y_{nom} & x_{meas,14} - x_{meas,1} & \cdots & x_{meas,14} - x_{meas,13} \\ 0 & 1 & y_{nom} & x_{nom} & y_{meas,14} - y_{meas,1} & \cdots & y_{meas,14} - y_{meas,13} \end{pmatrix} \quad (10)$$

$$\begin{pmatrix} T_x \\ T_y \\ \text{Exp} \\ R \\ \alpha_1 \\ \vdots \\ \alpha_{13} \end{pmatrix} = \begin{pmatrix} x_{meas,14} - x_{nom} \\ y_{meas,14} - y_{nom} \end{pmatrix}.$$

The total number of unknowns is 4 (for $T_x$, $T_y$, Exp and R)+13 (for $\alpha_1 \ldots \alpha_{13}$)=17. Hence, it may be desirable to measure at least 9 X and 8 Y marks (or 9 X and 8 Y marks) on a wafer in order to establish a least-squares solution of such a system. Solving the wafer model using a least-squares method may include, e.g., minimizing the following relation:

$$\sum_{\forall i} \sqrt{(x_{meas,i} - x_{nom})^2 + (y_{meas,i} - y_{nom})^2}. \quad (11)$$

If only the red (or only the green) color is considered, the number of unknown parameters reduces to 4 (for $T_x$, $T_y$, Exp and R)+6 (for $\alpha_1 \ldots \alpha_6$)=10, and 5 XY pairs may be sufficient. If only the odd diffraction orders of each color are known, the number of unknowns reduces to 4 (for $T_x$, $T_y$, Exp and R)+7 (for $\alpha_1$, $\alpha_3$, $\alpha_5$, $\alpha_7$, $\alpha_8$, $\alpha_{10}$, $\alpha_{12}$)=11, and 5 X and 6 Y marks (or 5 Y and 6 X marks) may be sufficient. If both only odd orders and only a single color is considered, the number of unknowns reduces to 4 (for $T_x$, $T_y$, Exp and R)+3 (for $\alpha_1$, $\alpha_3$, $\alpha_5$)=7, and 4 X and 3 Y marks (or 4 Y and 3 X marks) may be sufficient.

It will be understood that such a method of determining the measured position of a substrate W may also be applied to other objects that are provided with alignment marks 10 capable of generating more than one positional indicator for a certain direction, such as diffraction orders when illuminated by an alignment beam AB. Such a method may, for instance, also be used to determine the position and orientation of patterning means (mask) MA.

A method as described above may be applied to every single substrate W that is positioned under the exposure tool. However, one may also decide to determine the optimal weighing coefficients $\alpha_i$ for only one substrate W and use the results for subsequent substrates W that have been subjected to similar process steps. For example, it may be appropriate to assume that such subsequent substrates W will exhibit similar features, such that a reasonable calculation of the translation, expansion and/or rotation will be obtained using the same weighing coefficients. It is also possible to determine the optimal weighing coefficients $\alpha_i$ based on a batch, and use the results for other (e.g. subsequent) batches. Preferably, the weighing coefficients $\alpha_i$ are determined for every new batch. The first substrate W of a batch is then used to calculate new weighing coefficients $\alpha_i$, that are used for that batch. In such a case, the dynamic recipe as presented here only needs to be applied for the first substrate W of a batch. The rest of the substrates W may than be processed using a static recipe, e.g. using the weighing coefficients as calculated as a set of fixed weighing coefficients.

Also other strategies can be conceived. For instance, it is also possible to determine the weighing coefficients $\alpha_i$ based on a number of substrates W. One may also decide to determine the weighing coefficients $\alpha_i$ based on a moving average, for instance, based on the last 20 substrates W processed. Alternatively, a batch method as described above may be modified by calculating the weighing coefficients based on measurements from sample substrates from more than one batch. It will be clear to a person skilled in the art that several strategies may be conceived, without departing from the scope of the invention.

For example, one could first run a calibration batch to determine optimal values for one or more weighing coefficients $\alpha_i$, and apply those values to following batches. One could also monitor the coefficients in time. Variation of a weighing coefficient in time, i.e. a coefficient getting higher or lower, may be a sign that the process is drifting.

Also, the significance of particular weighing coefficients may be determined. If the value of a weighing coefficient has no significant meaning, for example, the weighing coefficient could be set to zero. The calculation may be repeated without the corresponding orders (e.g. the weighing coefficient equals zero). This process could be repeated in an iterative way, e.g., until a significant set of weighing coefficients is determined.

Application to so-called multigrating marks is also possible. A multigrating mark may have, for example, 3 good signals (orders) for each color. By monitoring the six coefficients, the best signal (grating) can be automatically identified and selected.

The weighing coefficient may further be made dependent on the strength of the received signal. For example, the strength of the signal originating from different diffraction orders may be measured, and if it is too low with respect to a certain threshold, a value of the weighing coefficient belonging to that diffraction order may be modified (e.g. set to zero).

Whilst specific embodiments of the invention have been described above, it will be appreciated that the invention as claimed may be practiced otherwise than as described. It is explicitly noted that the description of these embodiments is not intended to limit the invention as claimed.

The following table includes a list of symbols as applied herein:

| | |
|---|---|
| $T_x$; $T_y$ | Translation in x and y direction |
| $R_x$; $R_y$ | Rotation of the x-axis and y-axis respectively around the z-axis. |
| $Exp_x$; $Exp_y$ | Wafer expansion in x and y direction |
| $x_{nom}$; $y_{nom}$ | Nominal position of a mark on the wafer |
| $x_{meas,i}$ and $y_{meas,i}$ | Measured position of a mark on the wafer for, e.g., color and order corresponding to i |
| $\alpha_i$, $\beta_i$ | Recipe weight coefficient in x and y direction for, e.g., color/order combination corresponding to i |

The invention claimed is:

1. A lithographic apparatus comprising:
   a projection system configured to project a patterned beam of radiation onto a target portion of a substrate,
   a sensor;
   a processing unit arranged to communicate with the sensor; and
   a beam generator arranged to project an alignment beam to at least one of a plurality of alignment marks, of which desired positions are known,
   wherein the sensor is arranged to measure positional parameters for each of the plurality of alignment marks based on the projected alignment beam and to transfer the measured positional parameters to the processing unit, the positional parameters based on a plurality of diffraction orders generated by projecting the alignment beam to the at least one of a plurality of alignment marks, and
   wherein the processing unit is arranged to determine at least one parameter of a model providing information about a position of the substrate, based on the measured positional parameters, and
   wherein the measured positional parameters are weighted with variable weighing coefficients, the variable weighing coefficients based on the diffraction orders, and
   wherein the processing unit is arranged to determine a numerical value of at least one of the weighing coefficients and the at least one parameter of the model simultaneously.

2. The lithographic apparatus according to claim 1, wherein the at least one parameter of the model includes at least one of translation, rotation, and expansion.

3. The lithographic apparatus according to claim 1, wherein the plurality of alignment marks are formed as diffractive elements.

4. The lithographic apparatus according to claim 1, wherein the processing unit is arranged to determine the at least one parameter of the model based on a least-squares solution of an expression based on desired and measured positions of at least one of the plurality of alignment marks.

5. A lithographic apparatus comprising:
   a projection system configured to project a patterned beam of radiation onto a target portion of a substrate,
   a sensor;
   a processing unit arranged to communicate with the sensor; and
   a beam generator arranged to project an alignment beam to at least one of a plurality of alignment marks, of which desired positions are known,
   wherein the sensor is arranged to measure positional parameters for each of the plurality of alignment marks based on the projected alignment beam and to transfer the measured positional parameters to the processing unit, and
   wherein the processing unit is arranged to determine at least one parameter of a model providing information about a position of the substrate, based on the measured positional parameters, and
   wherein the measured positional parameters are weighted with weighing coefficients, and
   wherein the processing unit is arranged to determine a numerical value of at least one of the weighing coefficients together with the at least one parameter of the model, and
   wherein the processing unit is arranged to set the value of a weighing coefficient to zero when the signal strength of a corresponding positional parameter is below a certain threshold.

6. The lithographic apparatus according to claim 1, wherein the apparatus is further configured to project a patterned beam of radiation onto a target portion of the substrate based on the at least one parameter of the model.

7. The lithographic apparatus according to claim 1, wherein said processing unit is arranged to determine the numerical value of at least one of the weighing coefficients based on measurements of at least one substrate, and
   wherein the processing unit is arranged to use the determined numerical value of at least one of the weighing coefficients during a determination of the at least one parameter of the model for at least one other substrate.

8. The lithographic apparatus according to claim 1, wherein the processing unit solves for the at least one model parameter and the weighing coefficients by a least squares method and wherein a number of measured positional parameters corresponds to a sum of a number of model parameters with a number of the weighing coefficients.

9. The lithographic apparatus according to claim 8, wherein the at least one model parameter, weighing coefficients, and measured positional parameters are processed in accordance with:

$$\begin{pmatrix} 1 & 0 & x_{nom} & -y_{nom} & -x_{meas,1} & \ldots & -x_{meas,14} \\ 0 & 1 & y_{nom} & x_{nom} & -y_{meas,1} & \ldots & -y_{meas,14} \end{pmatrix} \begin{pmatrix} T_x \\ T_y \\ \text{Exp} \\ R \\ \alpha_1 \\ \vdots \\ \alpha_{14} \end{pmatrix} = \begin{pmatrix} -x_{nom} \\ -y_{nom} \end{pmatrix}$$

* * * * *

UNITED STATES PATENT AND TRADEMARK OFFICE
CERTIFICATE OF CORRECTION

PATENT NO. : 7,565,219 B2
APPLICATION NO. : 10/730254
DATED : July 21, 2009
INVENTOR(S) : Maurits Van Der Schaar et al.

It is certified that error appears in the above-identified patent and that said Letters Patent is hereby corrected as shown below:

On title page, item (75) Inventors
 replace "Jeroen Huijbregstse, Breda (NL)"
 with --Jeroen Huijbregtse, Breda (NL)--.

Signed and Sealed this

First Day of September, 2009

David J. Kappos
*Director of the United States Patent and Trademark Office*